(12) United States Patent
Perniola

(10) Patent No.: US 9,019,749 B2
(45) Date of Patent: Apr. 28, 2015

(54) METHOD OF PROGRAMMING A NON-VOLATILE RESISTIVE MEMORY

(71) Applicant: Commissariat a l'Energie Atomique et aux Ene Alt, Paris (FR)

(72) Inventor: Luca Perniola, Noyarey (FR)

(73) Assignee: Commissariat a l'Energie Atomique et aux Energies Alternatives, Paris (FR)

( * ) Notice: Subject to any disclaimer, the term of this patent is extended or adjusted under 35 U.S.C. 154(b) by 0 days.

(21) Appl. No.: 14/175,292

(22) Filed: Feb. 7, 2014

(65) Prior Publication Data

US 2014/0226391 A1   Aug. 14, 2014

(30) Foreign Application Priority Data

Feb. 8, 2013 (FR) ...................................... 13 51095

(51) Int. Cl.
*G11C 11/00* (2006.01)
*G11C 13/00* (2006.01)

(52) U.S. Cl.
CPC ........ *G11C 13/0069* (2013.01); *G11C 13/0007* (2013.01); *G11C 2013/0083* (2013.01)

(58) Field of Classification Search
USPC ........................................................ 365/148
See application file for complete search history.

(56) References Cited

U.S. PATENT DOCUMENTS

| | | |
|---|---|---|
| 2005/0158950 A1 | 7/2005 | Scheuerlein et al. |
| 2009/0237985 A1 | 9/2009 | Matsuzaki et al. |
| 2011/0317480 A1 | 12/2011 | Lung et al. |
| 2012/0081946 A1 | 4/2012 | Kawabata et al. |
| 2014/0192585 A1* | 7/2014 | Hashim et al. ................. 365/148 |

FOREIGN PATENT DOCUMENTS

| | | |
|---|---|---|
| EP | 2 402 953 A1 | 1/2012 |
| WO | WO 2006/078505 A2 | 7/2006 |
| WO | WO 2007/141865 A1 | 12/2007 |

OTHER PUBLICATIONS

U.S. Appl. No. 14/175,320, filed Feb. 7, 2014, Perniola.

(Continued)

*Primary Examiner* — Son Mai
(74) *Attorney, Agent, or Firm* — Oblon, McClelland, Maier & Neustadt, L.L.P.

(57) ABSTRACT

The invention relates to a method for pre-programming a matrix of resistive non-volatile memory cells, with said memory cells comprising a dielectric material positioned between two conducting electrodes, with said memory cells being initially in an original resistive state (original HRS) and the dielectric material being able to be so electrically modified as to bring the memory cell from the original resistive state (original HRS) to at least another resistive state (LRS, programmed HRS) wherein the resistance of the memory cell is at least twice and preferably at least ten times lower than the resistance of the memory cell in the original resistive state (original HRS), at least for a reading voltage interval, characterized in that the method comprises the following steps:
prior to mounting a component containing said matrix on a support,
programming the matrix by electrically bringing a plurality of cells from the original resistive state (original HRS) to said other resistive state (LRS, programmed HRS),
leaving the other memory cells in the original resistive state (original HRS) thereof;
mounting said matrix on a support, with the step of mounting comprising at least one of the following steps: a step of brazing, a step of welding.

30 Claims, 4 Drawing Sheets

(56) References Cited

OTHER PUBLICATIONS

French Preliminary Search Report issued Oct. 16, 2013, in French Application No. 13 51095 filed Feb. 8, 2013 (with Written Opinion and English Translation of Categories of Cited Documents).

French Preliminary Search Report issued Oct. 15, 2013, in French Application No. 13 51093 filed Feb. 8, 2013 (with Written Opinion and English Translation of Categories of Cited Documents).

French Preliminary Search Report issued Oct. 9, 2013, in French Application No. 13 51094 filed Feb. 8, 2013 (with Written Opinion and English Translation of Categories of Cited Documents).

* cited by examiner

FORMING

RESET

SET

METHOD OF PROGRAMMING A NON-VOLATILE RESISTIVE MEMORY

TECHNICAL FIELD OF THE INVENTION

The present invention relates, in general, to resistive non-volatile memories, and more particularly to resistive memories which may be used within the scope of an industrial process for manufacturing embedded systems wherein such memories can advantageously be pre-programmed in their production environment without the stored data being lost afterwards because of the heat constraints, and more particularly mounting constraints, which they are exposed to during the steps of welding or reflow soldering of the components. The invention more particularly relates to a method for programming resistive memory cells and a micro-electronic device integrating a matrix of memory cells pre-programmed according to the method.

STATE OF THE ART

In addition to electronic, optical or mechanical elements belonging to each system, computer embedded systems always use microprocessors or micro-controllers and electronic memories required for ensuring the operation thereof. Typically, all the components which compose an embedded system are mounted on one or more printed circuit(s) or electronic card(s), which are often also called PCB, i.e. "printed circuit board(s)". Mounting is generally automatized, in a production line. The electronic components are most often in the form of components intended to be surface-mounted (without any through-type insert). Then they are simply positioned on the printed circuit by a positioning machine. Welding or brazing paste shall have been deposited beforehand onto the terminals of the components and/or of the printed circuit. The printed circuit whereon the components are positioned is then placed in a heating furnace, typically a so-called tunnel furnace, wherein the temperature gradient is so adjusted as to melt the deposited paste, which provides, when cooled, a mechanical fixing of the components and an excellent electrical contact. This standard manufacturing operation of a printed circuit is called reflow brazing or soldering, in the technical literature.

At least a part of the memories composing an embedded system is nearly always of the non volatile type. For example, to be able to permanently store therein the operational code, also called the microcode, of the micro-processor(s) or micro-controller(s) which is/are used for providing the function which the embedded system has been designed for. Usual practice consists in the manufacturing process requesting that the non volatile part of the memories can be programmed prior to mounting onto the printed circuit. A very significant advantage of this procedure is that a specific code intended to test the printed circuit as soon as it is mounted, in order to check the integrity thereof, can for instance be pre-programmed in the non volatile part. Another exemplary advantage related to the possibility of pre-programming the non volatile memories relates to secure chip cards, also called "secure smart cards". The issuers of such cards, such as banks, prefer the confidential data they contain to be introduced prior to mounting, so that they don't have to check the distribution of such sensitive information beyond the manufacturing line.

If the operation code or the functional data the non volatile memory must contain have not been pre-programmed, they must be loaded in situ, i.e. into the non volatile memory after assembling thereof, and after the connection thereof with the other components on the printed circuit. Means have long been developed by the micro-electronics industry to provide this function after mounting. A usual practice consists in using the tests circuits which are contained in nearly all the circuits developed by this industry, more particularly the so-called JTAG ("Joint Test Action Group") circuits, which refers to a workgroup which enabled to define a strategy and means for testing printed circuits as from the mid eighties, in order to check the correct operation of ever more complex circuits. As a standard, the JTAG circuits make it possible to individually access the components mounted on a printed circuit through a specialized series interface which can also enable an in-situ programming of the non volatile part of the memory. The intrinsically small access time and the limited available bandwidth of this method result in the code loading being a very long operation which may slow down the manufacturing line.

Other means have been provided for the in-situ programming of the non volatile part of the memories which have their own disadvantages such as requiring specialised connection points which will have no functional utility and/or an interface dedicated to such function in order to enable, on the one hand, the writing of a code into the non volatile part of the memory, and, on the other hand, the controlling of the other components so that these can be inhibited, so as not to interfere with the code loading. This, of course, significantly complicates the design of the embedded system and also generally requires the development of a specialized programming tool for loading the code after mounting in the manufacturing line.

Whenever possible, the whole code, i.e. not only the test code, but also the functional code, is preferably loaded prior to mounting. This avoids an in-situ programming with all the drawbacks briefly mentioned above.

The presently used non volatile memories are mainly so-called Flash memories, wherein each memory point is a Metal Oxide semiconductor (MOS) having a floating grid wherein carriers are trapped. Programming such memories is executed by applying to the electrodes higher voltages than those used for reading same. Such voltages make it possible to bring charges into the floating grid, or to evacuate them therefrom, in order to permanently modify, when reading, the conduction threshold of the transistor, so as to be able to store at least two different electric levels, i.e. an information bit therein. Carriers are trapped and evacuated through the very thin oxide layer forming the grid of the MOS transistor by implementing quantal effects of the tunnelling effect or hot electron types. This type of non volatile storage is not particularly affected by temperature. Flash memories are not at all affected by the programming prior to mounting. Their contents is not affected by the reflow soldering operation described above, wherein the maximum temperature reached is typically about 245° C. for the soldering pastes containing lead. Using unleaded pastes, as required now for their not polluting property, increases temperature up to 260° C., even higher, which still has no negative effect on the retention of the data pre-programmed in this type of memory. The main disadvantage of the Flash memories is that the programming thereof requires, as mentioned above, applying significant voltages and currents to transfer charges into or from the floating grid. Writing therein is a relatively slow and complicated operation which may have to be carried out, depending on the internal structure thereof, of the so-called AND or OR types, on cell blocks which have to be erased prior to re-writing new data.

This is the reason why the designers of embedded systems now prefer using other types of non volatile memories which have none of these drawbacks. This more particularly concerns so-called "resistive" memories, which are globally called RRAM ("Resistive Random Access Memory") memories, wherein storage is obtained by reversibly electrically modifying the material composing each cell so that it can take at least two different resistance values, in order to store an information bit therein. Among the various types of existing resistive memories, those which are based on a normally insulating dielectric material are more particularly considered. Such memories, which are called OxRAM, a term which refers to the use of an oxide (Ox) as the dielectric material, implement an operation mode wherein at least a conducting filament or a conducting path, whatever its form, can be provided between two electrodes separated by the oxide, after the application of a sufficiently high voltage therebetween. When the filament has been formed, a low resistance state, generally called LRS, is obtained. This state may be reversed by a so-called "RESET" operation, in order to bring the memory back into a second high resistance state, or HRS, with the filaments being broken during such operation. When the filament has been formed for the first time, a so-called "SET" operation can bring the memory back again into a low resistance state, or LRS, by reforming at least one filament. Such operation requires the application of lower voltages.

However, unlike the high resistance state, a conducting filament, which is thermally unstable, is formed in a low resistance state. The service life of the conducting filaments, and thus the retention time of the information stored in this form, very quickly decreases with the increase in the temperature which they are exposed to. For the maximum temperature of 260° C. mentioned above, which is sustainably reached during a reflow soldering, the retention time can then be insufficient to reliably guarantee the retention of the information programmed therein beforehand. The resistive memories of the RRAM type thus cannot be usefully pre-programmed prior to mounting since the stored information will be lost during the reflow soldering operation.

Document US2012081946 disclosed a solution wherein a highly resistive state obtained by programming the cell is used.

It would then be particularly advantageous to have memory cells with a high integration density, at least similar to, or event greater than the above-mentioned Flash memories, which would also be able to retain information at relatively high temperatures. The present invention aims at reaching this object.

Another object of the invention is also to provide a solution to enable a memory cell not to lose a programming carried out beforehand during a mounting operation.

Other purposes, characteristics and advantages of this invention will become apparent upon examination of the following description and accompanying drawings. It is understood that other advantages can be included.

SUMMARY OF THE INVENTION

According to one embodiment, the invention relates to a method for pre-programming a matrix of resistive non-volatile memory cells, with said memory cells comprising a dielectric material positioned between two conducting electrodes, with said memory cells being initially in an original resistive state (original HRS) and the dielectric material being able to be so electrically modified as to bring the memory cell from the original resistive state (original HRS) to at least another resistive state (LRS, programmed HRS) wherein the resistance of the memory cell is at least twice and preferably at least ten times lower than the resistance of the memory cell preferably when a reading voltage is applied thereto, in a reading interval, with the method comprising the following steps:

prior to mounting a component containing said matrix on a support,
  programming the matrix by electrically modifying the dielectric material so as to electrically bring a plurality of selected cells from the original resistive state (original HRS) to said other resistive state (LRS, programmed HRS), leaving the other memory cells, i.e. the memory cells which have not been selected in their original resistive state (original HRS),
mounting said matrix on a support, during the step of assembling the memory cells being submitted to a temperature of at least 240° C.

It turns out that the original resistive state (original HRS) remains stable even when the cell receives a significant quantity of heat caused by the step of mounting which includes, for instance, a step of welding or of brazing. After mounting, the cells left in the original resistive state after programming remain in this state. On the other hand, the cells electrically brought from the original resistive state (original HRS) to the other resistive state (LRS, programmed HRS) may be affected by the additional heat from the step of mounting and their resistive state may be modified. However, these cells, even highly altered, never go back to their original resistive state. Besides, it turns out that, in any case, applying a reading voltage makes it possible to identify, after mounting, whether a cell is in the original resistive state (original HRS) or not.

The invention thus makes it possible to differentiate, after mounting:
  the cells which have not been programmed prior to mounting. These cells remain in the original resistive state after mounting.
  with respect to:
  the cells which have been programmed prior to mounting. Such cells may have been altered by mounting, but in any event, they are not in the original resistive state. Such cells are thus all the cells which are not in the original resistive state.

Such differentiation is for instance performed by applying a voltage selected in the reading interval. Applying a reading voltage does not alter the memory cell.

If a cell is not in the original resistive state, it may be concluded that it had been programmed prior to mounting.

The invention then provides for a simple and strong solution to retrieve the programming of a matrix of resistive non-volatile memory cells after a step of mounting during which a high thermal stress is applied to the matrix.

The present invention further has an advantage in terms of power dissipation. As a matter of fact, the memory cells may be read by applying a low voltage.

Optionally, the process according to the invention may also comprise at least any one of the following characteristics and steps:

According to one embodiment, the current flowing through the two conducting electrodes goes through the dielectric material. Preferably, the whole current flowing from one conducting electrode to the other one necessarily goes through the dielectric material.

According to one embodiment, the dielectric material is in contact with each one of the two conducting electrodes. Preferably, only the dielectric material is in contact with each one of the two conducting electrodes. Thus, no other material is present between the two conducting electrodes in the current flow. No other material is preferably present between the two conducting electrodes. More particularly, no phase-change material is present between the two conducting electrodes. More generally, the resistive cell comprises no phase-change material.

According to one option of this embodiment, said other resistive state is a second resistive state (LRS) directly obtained by applying a voltage from the original resistive state (original HRS).

According to an alternative option, said other resistive state is a third resistive state (programmed HRS). In addition, bringing the memory cell from the original resistive cell (original HRS) to the third resistive state (programmed HRS) comprises the following steps, executed prior to mounting:
applying a voltage to the memory cell so as to bring the memory cell from the original resistive state (original HRS) to a second resistive state (LRS);
applying a voltage to the memory cell so as to bring the memory cell from the second resistive state (LRS) to the third resistive state (programmed HRS).

A method according to claim 5, wherein the method comprises the following steps, executed prior to mounting the component containing said matrix on the support:
identifying whether the memory cell is in the original resistive state (original HRS);
if the memory cell is not in the original resistive state (original HRS), applying to the memory cell a voltage the amplitude of which is higher than said reading interval so as to bring back to, or to maintain the memory cell in said second resistive state (LRS).

Such voltage is higher, in absolute value, than the reading interval, for a bipolar and unipolar operation. In a bipolar operation, to make an electric RESET, a negative voltage (or a reverse voltage relative to the forming voltage) must be applied, as will be described in detail in the following, while referring to FIG. 4.

In a unipolar operation, to make an electric RESET, it is sufficient to keep the same polarization and to increase the voltage relative to the voltages used for reading.

Alternately according to another embodiment, the method comprises the following steps, executed prior to mounting the component containing said matrix on the support:
identifying whether the memory cell is in the original resistive state (original HRS);
if the memory cell is not in the original resistive state (original HRS), applying to the memory cell a voltage higher than the reading interval so as to bring the memory cell in a third resistive state (programmed HRS) wherein the resistance of the memory cell has a resistance which can be differentiated from the resistance of the memory cell in the original resistive state (original HRS) by applying a voltage selected in the reading interval.

The invention then provides for a simple and strong solution to retrieve the programming of a matrix of resistive non-volatile memory cells after a step of mounting during which a high thermal stress is applied to the matrix.

The present invention is particularly advantageous in terms of power dissipation. As a matter of fact, the memory cells may be read by applying a low voltage. Besides, during the step of controlling the loss of information resulting from the step of mounting, the control voltage is not applied to all cells, but only to those which are not in an original resistive state (original HRS). This results in a gain in power consumption and dissipation and a gain in programming time.

The invention thus makes it possible to reach high integration densities of the matrices of memory cells and to increase the strength thereof when exposed to a thermal stress.

Preferably the step of mounting comprises at least one among the following steps: a step of brazing, a step of welding or a process of the WLCSP type (the acronym for Wafer Level Chip Scale Packages), which is translated in French by procédé de réalisation d'un boitier à la taille d'une puce au niveau du substrat).

Preferably, the step of mounting comprises a step of brazing or welding of the components on the support, wherein the memory cells are submitted to a temperature of at least 140° C. for at least 10 seconds. Preferably, the step of mounting comprises the application of a temperature higher than or equal to 260 degrees Celsius for at least 10 seconds.

Preferably, the step of mounting, typically WLCSP, comprises a step during which the memory cells are exposed to a temperature above 300° C. for several minutes. Preferably, the step of mounting comprises the application of a temperature higher than or equal to 300 degrees Celsius for at least 30 seconds. Preferably the step of mounting comprises applying a temperature ranging from 320° C. to 375° C. for a duration from 40 to 80 minutes.

Generally, the original resistive state (original HRS) is the state obtained upon completion of the memory cell production process and which has not been altered by any programming current.

According to one embodiment, if a memory cell is identified as being in the original resistive state (original HRS), then the memory cell is left in the original resistive state (original HRS).

According to another embodiment, if a memory cell is identified as being in the original resistive state (original HRS), then the following steps are executed:
electrically modifying the dielectric material to bring the memory cell from the original resistive state (original HRS) to the second resistive state (LRS),
electrically modifying the dielectric material to bring the memory cell from the second resistive state (LRS) to a third resistive state (programmed HRS) wherein the memory cell has a resistance different from, typically higher than, that of the memory cell in the second resistive state (LRS).

Advantageously, the step of electrically modifying the dielectric material so as to bring the memory cell in said third resistive state (programmed HRS) is a RESET operation. For instance, the step of electrically modifying the dielectric material until the memory cell is brought to the third resistive state (programmed HRS) consists in breaking, using a RESET operation, at least one conducting path formed beforehand between the conducting electrodes.

Advantageously, in the third resistive state (programmed HRS) the memory cell has a resistance higher than that of the memory cell in the second resistive state (LRS) so that a reading circuit can identify whether the cell is in the second resistive state (LRS) or in the third resistive state (programmed HRS). Typically, the reading circuit comprises means enabling to apply a voltage of at least 50 mV to the terminals of the memory cells and preferably ranging from 50 mV to 200 mV.

Advantageously, in the third resistive state (programmed HRS), the memory cell has a resistance lower by at least a factor 2 than the resistance of the memory cell in the second resistive state (LRS) and, preferably by at least an order of magnitude, i.e. a factor 10 as regards the resistance.

In the third resistive state (programmed HRS), the memory cell has a lower resistance than that of the memory cell in the original resistive state (original HRS). Preferably, the memory cell in the third resistive state (programmed HRS)

has a resistance lower by at least a factor 2 and preferably by at least a factor 10 than that of the memory cell in the original resistive state (original HRS).

For instance, the step of electrically modifying the dielectric material until the memory cell is brought to said second resistive state (LRS) consists in reforming, in the dielectric material, at least one conducting path between the conducting electrodes. Advantageously, the step of electrically modifying the dielectric material so as to bring the memory cell in said second resistive state (LRS) is a SET operation.

The invention thus makes it possible to keep, after mounting, an identifiable voltage difference between, on the one hand, the memory cells which had been electrically modified prior to mounting, and, on the other hand, the cells which had not been electrically modified prior to mounting.

Depending on the various embodiments, it will be decided to modify or not, after mounting, the resistive state of the memory cells which had been electrically modified prior to mounting. Thus, the memory cells which were in the second resistive state (LRS) prior to mounting can, after applying the control voltage after mounting, either be brought back to the second resistive state (LRS) or be brought to the third resistive state (programmed HRS).

As mentioned above, it will be also be decided to modify or not, after mounting, the resistive state of the memory cells which had been electrically modified prior to mounting. The memory cells which were in the original resistive state (original HRS) prior to mounting will thus:

either all be kept in the original resistive state (original HRS),
or all be brought to the third resistive state (programmed HRS),
or all be brought to the second resistive state (LRS).

Care shall of course be taken that, after mounting, the cells left in the original resistive state during mounting are not, after mounting and after re-programming, if any, in a resistive state similar to that of the other cells.

Then, during the operation of the cell, it may be decided to have one of the following couples in the same matrix of cells:

original resistive state (original HRS)/second resistive state (LRS). This couple has the advantage of having a very significant resistive difference between the two states, which enables a very reliable reading even with a relatively little accurate reading device.
original resistive state (original HRS)/third resistive state (programmed HRS). This couple has the advantage of having a very significant resistive difference between the two states
third resistive state (programmed HRS)/second resistive state (LRS);

Depending on the embodiments, it may be decided to modify or not, prior to mounting, the resistive state of the memory cells which had be brought to the second resistive state (LRS) from the original resistive state (original HRS). The memory cells which were in the second resistive state (LRS) prior to mounting thus can, still prior to mounting, either all be left in the second resistive state (LRS) or be brought to the third resistive state (programmed HRS) by applying a voltage.

The original HRS/LRS couple has the advantage of requiring only one programming of the cells.

The step of identification is preferably executed on all the memory cells in the matrix.

Advantageously, said reading interval ranges from −4 to 4 volts, preferably from −0.1 to 0.1 volts, more preferably from −0.05 to 0.05 volts and still more preferably from 0 to 0.01 volts. The voltages applied during the step of identifying are thus very low, which results in a low power dissipation.

Advantageously, the resistances of the memory cells of the matrix in the original resistive cell (original HRS) are included in a first range of values, and the resistances of the memory cells in the second resistive state (LRS) are included in a second range of values. Besides, the first and second ranges are separated at least for voltages included in said reading voltage interval. Preferably the first and second ranges show a discrepancy of at least an order of magnitude, and preferably two orders of magnitude, at least for voltages included in said reading voltage interval.

Preferably, the resistances of the memory cells in the third resistive state (programmed HRS) are included in a third range of values, with the first and the third ranges being separated at least for voltages included in said reading interval. Preferably the first and third ranges show a discrepancy of at least an order of magnitude of resistance, and preferably at least two orders of magnitude, at least for voltages included in said reading voltage interval.

Preferably, the second and third ranges show a discrepancy of at least a factor 2, and preferably at least a factor 10 at least for voltages included in said reading voltage interval.

Advantageously, identifying whether each memory cell is in the original resistive state (HRS) comprises: applying on each memory cell a voltage included in said reading interval and; measuring the intensity of the current flowing through the memory cell and preferably computing the resistance of such cell in said reading voltage interval, in order to deduce therefrom whether the resistance of such memory cell is included in the first range of values.

If the measured current value makes it possible to determine whether the resistance of the memory cell is not included in such first range of values, then it is deduced therefrom that the memory cell is not in the original resistive state. It can either be in the LRS state, or have been unintentionally brought to a more resistive state (programmed HRS) because of the additional heat during mounting.

According to one embodiment, the method comprises, after the programming and prior to mounting, at least one cycle of steps on said plurality of cells, i.e. on the selected cells which have been brought to the second resistive state (LRS) prior to mounting, with each cycle consisting in:

electrically modifying the dielectric material to bring said memory cells from the second resistive state (LRS) to a third resistive state (programmed HRS) wherein the memory cells have a resistance higher than that of the memory cell in the second resistive state (LRS), then
electrically modifying the dielectric material to bring back said cells to said second resistive state (LRS).

Several step cycles are preferably carried out.

Advantageously, upon completion of at least one step cycle, the selected cells are checked to be in the second resistive state (LRS), the selected cells which are not in the original resistive state (LRS) are identified, and the contents of the cells identified is transferred to other memory cells.

Preferably, the step of mounting the component containing said matrix on the support comprises mounting the component onto a printed card, an electronic card, another electronic component or a box.

According to another embodiment, the invention relates to a method for pre-programming a matrix of resistive non-volatile memory cells, with said memory cells comprising a dielectric material positioned between two conducting electrodes, with said memory cells being initially in an original resistive state (original HRS) and the dielectric material being able to be so electrically modified as to bring the memory cell from the original resistive state (original HRS) to at least another resistive state (LRS, programmed HRS) wherein the resistance of the memory cell is at least twice and preferably at least ten times lower than the resistance of the memory cell in the original resistive state (original HRS), at least for a reading voltage interval, characterized in that the method comprises the following steps:

prior to mounting a component containing said matrix on a support, programming the matrix by electrically modifying the dielectric material so as to electrically bring a plurality of selected cells from the original resistive state (original HRS) to said second resistive state, leaving the other memory cells, i.e. the memory cells which have not been selected in their original resistive state (original HRS), mounting said matrix on a support, during the step of assembling the memory cells being submitted to a temperature of at least 240° C.

Optionally, the process according to the invention may also comprise at least any one of the following characteristics and steps:

According to an advantageous but only optional embodiment, the method also includes the following steps executed after mounting the component containing said matrix on the support for at least a set of memory cells of the matrix and preferably for all the memory cells of the matrix: identifying whether each memory cell is in the original resistive state (HRS) by applying to each memory cell a voltage included in said reading interval. if the cell has the resistance of the original resistive state (original HRS), deduce therefrom that the cell was in the original resistive state (original HRS) after programming and prior to mounting; otherwise, deduce therefrom that the cell was not in the second resistive state (original LRS) after programming and prior to mounting.

According to an advantageous but only optional embodiment, prior to mounting, a voltage with a higher magnitude than the reading interval is applied to the cell in the second state, so as to bring the cell from the second resistive state (LRS) to a third resistive state (programmed HRS). Advantageously, after mounting, the cells in the original resistive state can be differentiated from those which are no longer in this state.

According to a first embodiment, if the memory cell is not in the original resistive state (original HRS), a control voltage the amplitude of which is higher than said reading interval is applied to the memory cell so as to bring back or to maintain the memory cell in/to said second resistive state (LRS).

Thus, after reading the resistance of each cell, the cells which had been left in their original resistive state (original HRS) will not be affected in any way. On the contrary, the cells which do not have the resistance of the original resistive state (original HRS) are submitted to an operation so that they are all in the same resistive state. According to this first embodiment, this resistive state common to all the cells which had been programmed is the second resistive state (LRS).

In the case where this resistive state common to all the cells which had been programmed is the second resistive state (LRS), a simple explanation would be that the cells wherein a conducting filament had already been formed and the filament of which had been partially broken because of the additional heat generated by the step of mounting, are brought back to the conducting state (LRS), i.e. the filament is reformed. The cells which had been made conducting during the step of programming and which had kept the conducting state (LRS) in spite of the addition of heat of the step of mounting will remain in this conducting state.

Preferably, the step of applying to the memory cell a voltage higher than the reading interval so as to keep or to bring back the memory cell in/to said second resistive state (LRS) comprises applying a voltage able to maintain, in the dielectric material, a conducting path between the conducting electrodes, if such conducting path is existing or to reform, in the dielectric path, at least one conducting path between the conducting electrodes. Thus, if the memory cell is in the second resistive state (LRS) after mounting, the control voltage does not affect the memory cell which remains in this state. On the other hand, if the memory cell switched, after the step of mounting, to a resistive state which is neither the original resistive step, nor the second resistive state, then the control voltage brings the memory cell back to the second resistive state (LRS).

Typically, this step comprises applying a voltage ranging from 500 mV to 2.5V, and preferably from 1V to 2V. The negative or positive polarity of the voltage is adjusted to actually produce the SET operation.

Generally, a voltage higher than said reading interval is applied to the memory cell in order to bring the memory cell to the second resistive state (LRS).

According to a second embodiment, which is alternative to the first one mentioned above, if the memory cell is not in the original resistive state (original HRS), applying to the memory cell a voltage, the amplitude of which is higher than the reading interval so as to bring the memory cell in a third resistive state (programmed HRS) wherein the resistance of the memory cell has a resistance which can be differentiated from the resistance of the memory cell in the original resistive state (original HRS) by applying a voltage selected in the reading interval.

Thus all the cells which had been programmed prior to mounting will be in the programmed HRS state after mounting and it will be possible to differentiate these from the original HRS state.

Preferably, but optionally, in the third resistive state (programmed HRS), the memory cell has a resistance lower by at least a factor 2 than the resistance of the memory cell in the original resistive state (original HRS) and, preferably by at least a factor 10. The cells which had been programmed prior to mounting can thus be easily differentiated from those which had not been programmed.

The object of the present invention is also a micro-electronic device comprising a matrix of pre-programmed memory cells implementing a method according to the invention.

According to another embodiment, the object of the invention is also a micro-electronic device comprising a matrix of non volatile resistive memory cells comprising a dielectric material positioned between two conducting electrodes, with the cell being so configured that electric current flows through the dielectric material when the conducting electrodes are connected to an electric source, with the dielectric material being able to be electrically modified so as to bring the memory cell from an original resistive state (original HRS) corresponding to a first resistive state to at least another resistive state (LRS, programmed HRS) wherein the resistance of the memory cell is at least twice lower than the resistance of the memory cell in the original resistive state (original HRS), wherein the matrix is contained in a component, wherein the component is mounted on a support, characterised in that some cells of the matrix are in the original resistive state (original HRS) and in that the other cells are in a resistive state different from the original resistive state (original HRS).

Micro-electronic device means any type of device produced with micro-electronic means. Such devices more particularly concern, in addition to purely electronic purposes devices, micro-mechanical or electro-mechanical devices (MEMS, NEMS . . . ) and optical or opto-electronic devices (MEOMS . . . )

BRIEF DESCRIPTION OF THE FIGURES

The goals and objectives as well as the characteristics and advantages of the invention will emerge better from the detailed description of an embodiment of this latter, illustrated by the following accompanying drawings in which.

The drawings attached are given as examples and are not limiting to the invention. These are schematic drawings intended to facilitate the understanding of the invention and are not necessarily at the same scale of the practical applications. More particularly, the relative thickness of the various layers and films are not a representation of reality.

DETAILED DESCRIPTION OF THE INVENTION

It should be noted that, within the scope of the present invention, the words "on", "lies above" or "under" or the equivalent thereof do not necessarily mean "in contact with". Thus, for instance, depositing a first layer on a second layer does not necessarily mean that both layers are directly in contact with each other, but this means that the first layer at least partially covers the second layer by being either directly in contact therewith or by being separated therefrom by another layer or another element.

Within the scope of the present invention, pre-programming means programming some memory cells, which is carried out prior to mounting the matrix onto a support, typically during an operation using a temperature higher than or equal to 200° C.

Figure 1A:
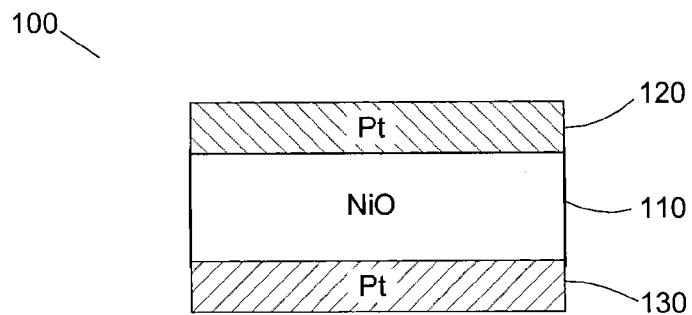
FIGS. 1a to 1c briefly disclose an exemplary RRAM memory of the OxRAM type and the operation thereof.
Figure 1B:
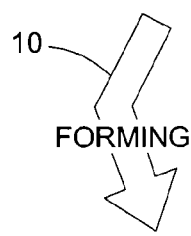
Figure 1B:
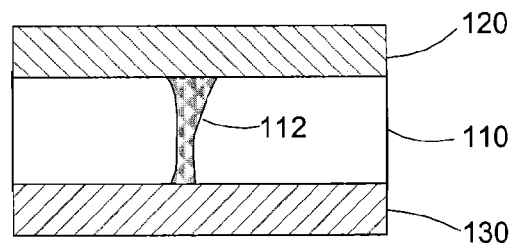
Figure 1C:
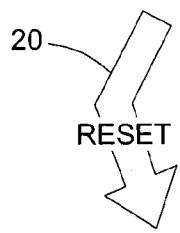
Figure 1C:
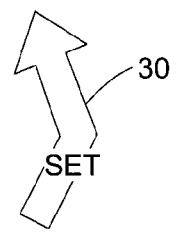
Figure 1C:
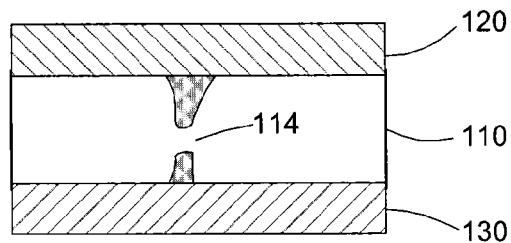

FIGS. 1a, 1b and 1c briefly disclose an exemplary resistive (RRAM) memory of the OxRAM type and the operation thereof. It should be noted here that the operating mode of other RRAM memories is similar thereto. These are for instance so-called CBRAM memories, the acronym for "Conductive Bridge Random-Access Memory", where, as shown by the name, "Conductive bridges" similar to the filaments described above are formed in a non conductive material. Such memories, as well as other ones, based on the same principles, are also liable to take advantage of the invention and the invention is limiting none of the resistive memory types.

It should be noted here that the invention is liable to be applied to whatever mechanism implemented by the non volatile memory considered, more especially if the cell resistance, in its initial state, i.e. prior to any application of a programming current, is clearly differentiated from the resistance it shows after programming.

FIG. 1a illustrates the structure of a memory cell OxRAM 100 wherein the dielectric material 110 is, in this example, nickel oxide (NiO) comprised between two metal electrodes, 120 et 130, made of platinum (Pt).

FIG. 1b illustrates the initial forming of a conducting filament 112 resulting from the application, between the two metal electrodes, of a suitable voltage, which depends, among other things, on the nature of the materials used, as will be seen in FIG. 2.

It should be noted here that the physico-chemical phenomena leading to the forming of a conducting filament 112 or a plurality of filaments resulting from the application of a sufficient electric voltage on the electrodes and the very nature of the filament or the conducting path created in oxide, are not yet understood by the scientific community working in this field. Various mechanisms have been considered to explain the forming of the filaments which include the presence of flaws and the migration of the metal composing the electrodes. However, as shown in FIG. 1b, during a first step 10, the initial forming of at least one conducting filament 112 or a conducting path, of any kind, by applying a sufficient potential difference between the two electrodes 120 and 130, can be observed The memory cells according to the invention have several states which correspond, each to a level of electric resistance of the cell. Three states can thus be counted:

an original resistive state, also called the original non conducting state or the original highly resistive state. In the present patent application, this state is also called the original HRS, the acronym for original highly resistive state. This state is also called the first resistive state.

Original non conducting state refers to the state obtained prior to any application of a voltage aiming at modifying the resistivity of the memory cell. Such original state is obtained after the formation of the dielectric layer and the electrodes. Advantageously, this original state is obtained upon completion of the ultimate phases of the manufacturing process, which mainly consist in interconnecting the elementary components, typically the memory cells with the card, and to the outside, using metal pads and connections, generally defined by photolithography. Such ultimate phases are generally called BEOL, the acronym for "Back-End Of Line", i.e. steps executed at the "end of the production line". Generally, during such BEOL steps, the memory cells must resist temperatures which may reach 400° C., typically, for a few minutes, and even a few dozens of minutes. Advantageously, the step of programming the matrix in order to electrically bring a set of selected cells from an original non conducting state to a conducting or at least a resistive state (LRS) is executed after BEOL. Advantageously too, during the step of mounting, a thermal stress smaller than the one applied during the BEOL steps, typically temperatures lower than those applied during the BEOL, is/are applied to the memory cells.

In this state, the information binary coded by the cell is for example a "0".

a conducting or low resistive state, also called a low resistive state. This state is also called the second resistive state. To be brief and clear in the present patent application, this state is also called the LRS state. LRS is the acronym of low resistive state. This LRS state is obtained by applying a voltage to the memory cell in the original HRS state. This state is thus obtained directly from the original resistive state (original HRS).

The increase in conductivity in this LRS state can be explained by the forming of filaments. More generally, a state is called a conducting state, when the memory cell has a resistance lower than the resistance it has in a non-conducting or resistive state. As a non-restricting example, a state wherein the resistance of the cell is lower than or equal to 1.5 kilo-Ohms and preferably lower than 1,000 Ohms can be called a conducting or electrically low resistive state. Such resistance values may vary significantly according to the applications and/or the structure and the composition of the memory cell.

In this state, the information binary-coded by the cell in the LRS state shall be, for instance, "1" if the information coded by the cell in the original HRS state is a "0". On the contrary, the information binary-coded by the cell in the LRS state shall be, for instance, "0" if the information coded by the cell in the original HRS state is "1".

a programmed resistive state or programmed highly resistive state or programmed high resistance state. This state is also called the third resistive state. To be brief and clear in the present patent application, this state is also called the "programmed HRS" state. This HRS state is obtained by applying a voltage to the memory cell in the original LRS state. The resistance of the memory cell in this programmed resistive state is however always lower than the resistance of the cell in the original highly resistive HRS state (original HRS).

The operation consisting in bringing the memory cell from the LRS state to the programmed HRS state is usually called the RESET operation. According to the applications, it may be considered that a memory cell in the programmed HRS state carries the "0" information if the cell in the LRS state carries the "1" information, or conversely, that the memory cell in the programmed HRS state carries the "1" information if the cell in the LRS state carries the "0" information.

The original HRS, LRS and programmed HRS states have different resistances. More precisely, the resistances of the cells in the original HRS state must be clearly differentiable from the resistance of the cells in the programmed HRS state or in the LRS state, and this is true for all the cells in the device.

Typically the invention applies to all the memory cells for which the distribution of the resistances in the original HRS state do not overlap the distribution of the resistances in the programmed HRS or LRS states. A discrepancy between the resistance must then exist between the distributions. Preferably, this discrepancy between the resistance is equal to at least a factor 2, or more preferably at least a factor 10 and still more preferably at least a factor 100.

According to the type of OxRAM memory considered, of which FIG. 1 is only one example, two different operating modes can be noted:

One is unipolar and not polarized. This means that the operations of forming or re-forming a conducting filament or SET, and of breaking the filament or RESET, are not dependent on the polarity of the applied voltage.

The other one is bipolar or polarized. The SET and RESET operations are executed with opposed polarities.

Whatever the operating mode, FIG. 1c illustrates the breaking 114 of the filament which is obtained upon completion of a RESET operation 20 which places or re-places the memory cell in a high resistance (programmed HRS) state. The re-forming 112 of the filament is obtained upon completion of a SET operation 30. The memory cell is then again in a low resistive state (LRS).

FIGS. 2a to 2d illustrate other exemplary RRAM memories using different dielectric material and electrode structures. The invention is not limited to these other examples and extends to many other memory cells structures complying with the above-mentioned conditions to execute the resistivity modification operations.

Figure 2A:
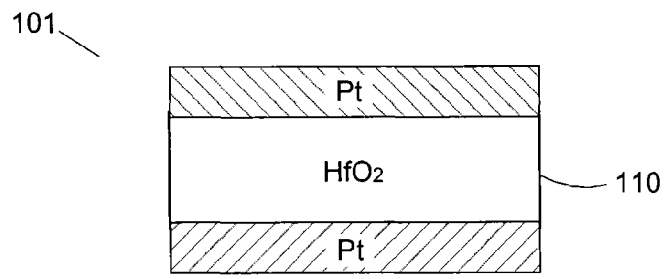
FIGS. 2a to 2d illustrate other exemplary RRAM memories using different dielectric material and electrode structures.

FIG. 2a shows a first structure 101 similar to that of FIG. 1a, wherein the dielectric material 110 is then made of hafnium oxide (HfO2). It should be noted that the scientific community has reached a consensus and come to the conclusion that the conducting state of a memory cell made of hafnium oxide is obtained because filaments are formed, which are made of the aggregation of oxygen vacancies.

HfO2 is deposited by ALD, the acronym for <<atomic layer deposition>> i.e. <<deposition of atomic layers>> in a specialized device, under the following conditions:
    deposition temperature: 350° C.;
    pressure: 1 Torr;
    precursor gases: Vapor phase Hafniumtetrachloride (HfCl4) and hafnium oxide (HfO2), sent in separate cycles onto the wafer. A complete cycle is composed of: one pulse of HfCl4, one nitrogen (N2) draining, one pulse of water (H2O), 1 nitrogen draining.
    180 cycles are necessary to grow 10 nm of HfO2.

The list of materials wherein conducting filaments are liable to grow potentially comprises, in addition to the above-mentioned nickel and hafnium oxides, all oxides which operate according to the same model, i.e. from the forming of oxygen vacancies.

Such FIGS. 2a-2d clearly show that the dielectric material 110 is positioned in the current flow. The current flowing from one electrode 120, 130 to the other electrode must necessarily go through this dielectric material 110. As illustrated in these figures, the dielectric material 110 is in contact with each one of the two electrodes 120, 130. No other material is provided between the dielectric material 110 and the two electrodes 120, 130 when producing the cell.

Figure 2B:
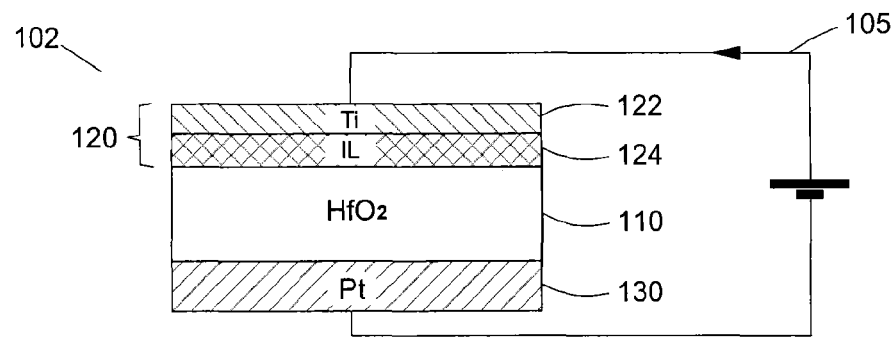

FIG. 2b illustrates a second structure 102 of a memory cell wherein the upper electrode 120 is different from the lower electrode 130. More particularly, the upper electrode comprises two layers, one 122 of which is made of titanium (Ti). The other one constitutes an interface layer 124 with hafnium oxide 110. This is a layer of HfO2 substoichiometric in oxygen. It is designated by the acronym "IL" for "interface layer". The layer 124 is formed naturally, because of titanium (Ti) in the layer 122 which absorbs the oxygen in the layer 110 made of HfO2. The layer 124 is not intentionally deposited. The layer 122 only constitutes the upper electrode proper, a part of titanium of which will melt with HfO2, as per the above mentioned phenomenon. In the structure shown in FIG. 2, the lower electrode 130 is made of platinum, as before. In FIG. 2b, and in the following asymmetric structures, the positive voltages are applied as indicated by reference 105 for the forming 10 and the SET 30 operation.

Figure 2C:
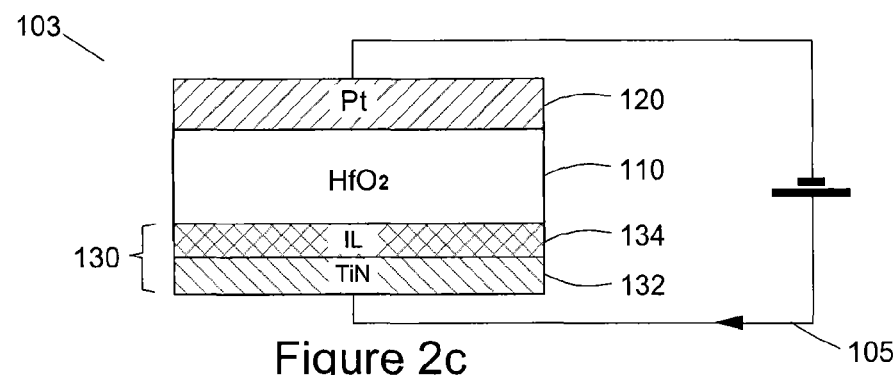

FIG. 2c illustrates a third structure 103 of a memory cell wherein the upper electrode 120 remains in platinum. In this case, the lower electrode 130 comprises two layers. The layer 134 is identical to the interface layer (IL) described above. The layer 132 is made of titanium nitride (TiN).

Figure 2D:
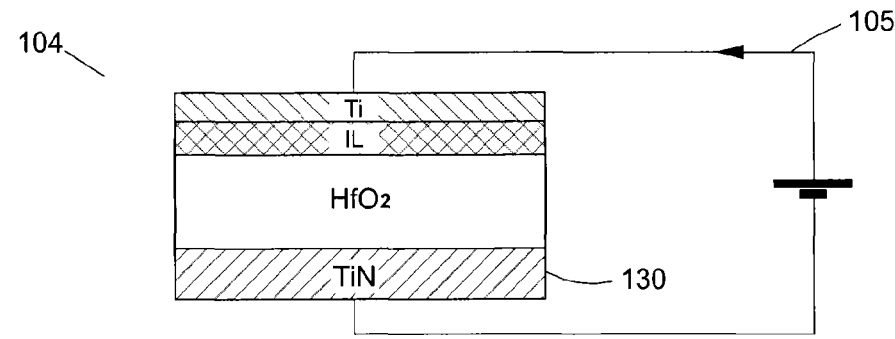

FIG. 2d illustrates a fourth structure 104 of a memory cell which is similar to the structure 102 disclosed in FIG. 2b. The difference lies in that the lower electrode 130 is then made of titanium nitride (TiN) instead of platinum.

Figure 3A:
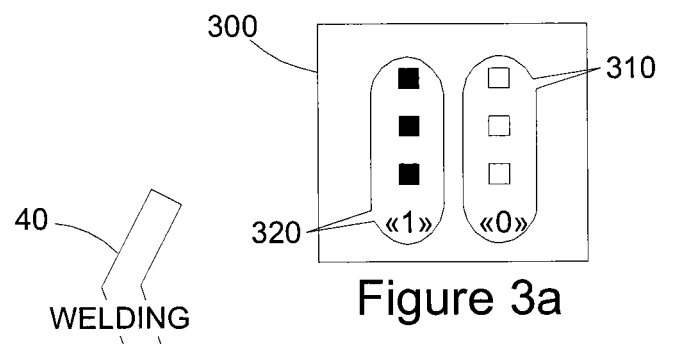
FIGS. 3a to 3c illustrate the pre-programming process according to the invention.
Figure 3B:
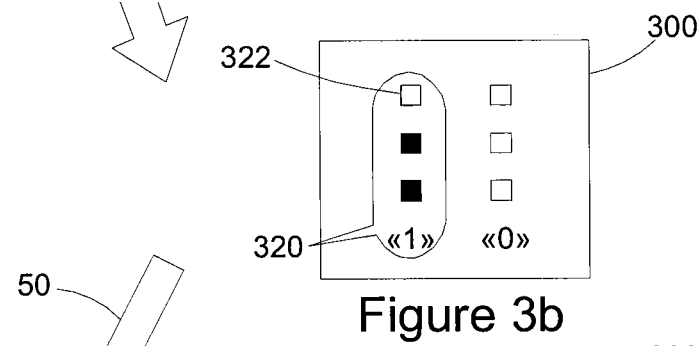
Figure 3C:
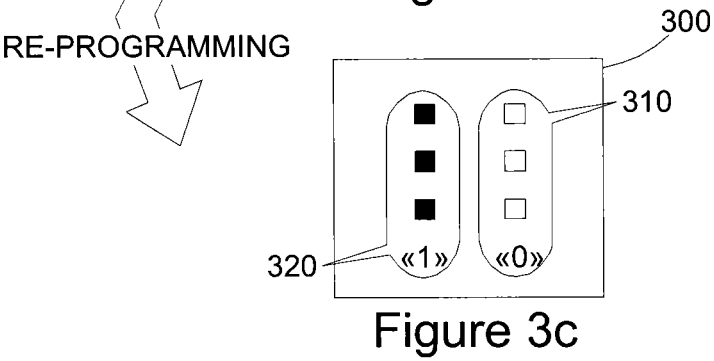

FIGS. 3a, 3b and 3c illustrate the pre-programming method of the invention which may be applied to memory cells matrices of the same type as those described in the preceding Figures.

FIG. 3a illustrates the step of pre-programming which is executed on each memory matrix 300 typically contained in an electronic chip wherein information is desired to be stored. In the context of the invention, the storage is advantageously executed, for the reasons enumerated in the State of the Art section, at the end of the chips manufacturing cycle, prior to mounting on a printed circuit constituting the whole or a part of an embedded system, whereon they will be exposed to the temperatures generated by the reflow soldering of the components. The electrical pre-programming at the end of the programming cycle may be executed using the conventional means developed by the micro-electronics industry. Pre-programming may more particularly be executed using suitable electro-mechanical tooling on all the chips contained on a wafer prior to cutting the latter or on each chip, separately, after cutting the wafer.

Whatever the stage of production during which pre-programming is executed, and whatever the means used, the invention provides that information can be pre-programmed in two forms:

a set of memory cells 310 is left in the original state, i.e. the state resulting from the production cycle. No electric signal is applied to these cells, which might modify the physico-chemical structure thereof. As a matter of fact, the voltages which may be applied are always far lower than the voltages which should be applied to have the cell switch to the LRS state, i.e. to obtain the initial forming 10 of the conducting filaments. The cells in this set, the material of which is left in its original "as deposited" state, are then in a very high, almost not conducting, state. It should be noted here that this original resistive state is always far higher than the programmed HRS state, i.e. obtained by a RESET operation, wherein the filaments are electrically broken. A characterization of these resistive states is disclosed in FIG. 4.

Another set of memory cells 320, generally the complementary set of the memory matrix 300 desired to be pre-programmed, is selected, wherein conducting filaments will be electrically formed, as explained above, on each cell. These memory cells will then be put in a low resistive state (LRS). It should be noted that all the memory cells of the memory matrix of a chip desired to be pre-programmed for a particular application may not be, or are often not used in practice. Depending on the specific embodiments of the invention, the memory cells which are not used by the application may be used as test cells, as already mentioned for the preceding Figure. They can be left in the original state (original HRS) or on the contrary, be placed intentionally in the LRS state, as well.

It should be noted here that the "0" and "1" figures are currently used to refer to the binary state of a memory cell. In the field of the invention, "0" is generally associated with the programmed HRS state electrically obtained upon completion of a RESET operation or with the very high resistive original HRS state mentioned above. The <<0>> state of the cell having a high, or even a very high resistance is recognized by a peripheral reading circuit (not shown) of the matrix in the form of an absence of current, or of a current remaining sufficiently weak not to be detected by the latter. On the contrary, in the LRS state, the reading circuit can detect a higher current flow and this state is generally associated with figure <<1>>. This most often used convention is also used in the following description of the present invention. The opposite convention could however be used as well. In the ordinary language shared by all those who work in this field, the step of pre-programming thus consists in programming "1"s, i.e. low resistance values, in a set of memory cells which is specific to a given application. The other cells are left in their original highly resistive state, i.e. in the "0" state.

FIG. 3b illustrates the effect of an application of heat on the memory matrices 300. As mentioned above, this additional heat is typically brought by the step of mounting the component containing the matrix of memory cells on a support such as an electronic card, a box encapsulating the component or another component. Such mounting operation comprises, for instance, a step of reflow soldering 40. Typically, during this step of mounting, the memory cells are submitted to a temperature ranging from 150° C. to 300° C. and most often ranging from 240° C. to 300° C.

As seen, the pre-programmed "1" state (LRS) is thermally unstable. At least some cells 322, or even all of them in the set 320, are liable to be affected by a temperature which may reach, as mentioned typically 260° C., for a time of about 2 minutes. The filaments 112, which have been formed for pre-programming shall then be partially broken 114, as after a RESET operation. Such cells thus unintentionally change from an LRS state to a programmed HRS state.

FIG. 3c illustrates the result of a preferred but optional embodiment of the invention which provides that, after mounting pre-programmed chips on their printed circuits, and thus after the step of adding a large quantity of heat (for instance during welding), all the pre-programmed memory cells (i.e. the cells which are no longer in the original HRS state after mounting) contained in these chips are "re-programmed" again. Such step of re-programming is advantageous but not compulsory, within the scope of the invention.

The step of reprogramming 50, consists in restoring the <<1>> binary states, which are thermally unstable, and which may have been affected by the mounting operation. It is executed on the basis of a prior measure of the resistance of each cell. The resistance of the cell is measured under "low field" conditions, by applying moderate voltages which cannot affect the value thereof. Such voltage may be called the reading voltage or the detection voltage.

Such reading voltage is selected from an interval of reading voltages. The reading voltages interval comprises all voltages, whether positive or negative, for which the amplitude is smaller than the amplitude which would modify the resistance of the cell. This interval is preferably so defined as to provide for a safety factor by being sufficiently different from the minimum amplitude which modifies the resistance of the memory cell.

Figure 4:
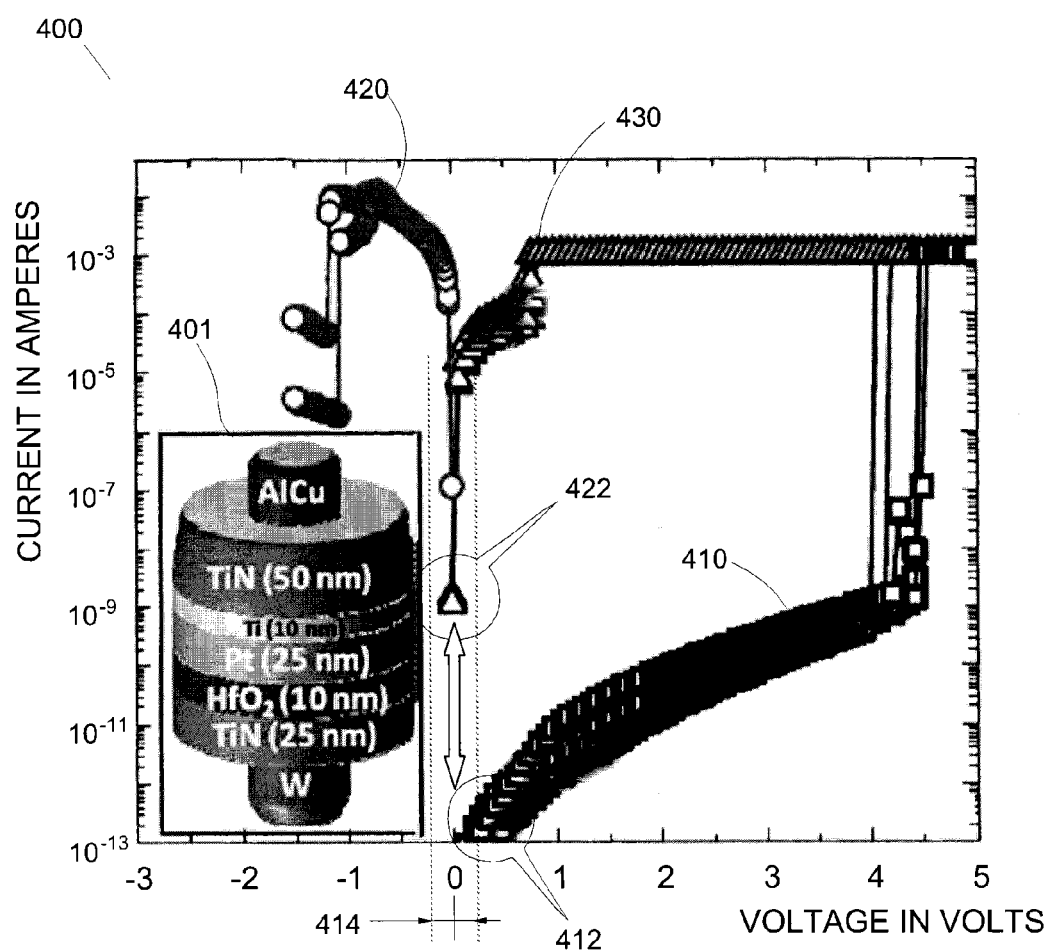
FIG. 4 illustrates the various resistive states that an exemplary memory cell may take according to the invention.

As illustrated in FIG. 4 hereunder, the measurement is typically made by applying a few hundreds of millivolts. Typically, the voltage applied to each memory cell to identify whether it is in the original HRS state or not ranges from 10 mV to 200 mV, and more precisely, from 50 mV to 100 mV. Such figures must be considered in absolute value, since positive or negative voltages may be applied. As described hereinunder when referring to FIG. 4, the reading voltages interval is preferably centered on 0 and comprises positive and negative voltages. Under these conditions, the cells which have been programmed on "1" prior to reflow soldering can be retrieved if it is noted that those which had been left in their original state have a resistance value, non only far higher than those in which the filament has been broken and which remained in the LRS state, but also far higher than those in which the filament has been broken and which have returned to the programmed HRS state, like after a RESET operation. On the basis of this note, the pre-programmed "1" states can be electrically restored by a SET operation, after reading the resistance of each cell. Such restoration is thus executed on all the cells for which it is detected that the resistance is not that of the cells which have been left in their original state and wherein the material has remained "as deposited". This voltage applied to keep or to bring back the cells in/to the LRS state may be called a control voltage or an LRS state re-programming voltage.

It should be noted that this step of re-programming 50 which is executed only once after mounting, does not require to know the specific pre-programming which has been used at the end of the production line to tailor the matrix 300. As a matter of fact, this characteristic step of the invention provides that all the memory cells of a pre-programmed memory matrix are systematically read to be re-programmed if need be (i.e. if they no longer are in the original HRS state after mounting), as described above. This step of reading implements a weak current with a low power dissipation.

As regards the cells which have been left in their original state, i.e. all the cells 310, two options are available for the step of re-programming:

a first option consists in leaving these in their highly resistive state (original HRS). The functional reading circuit (not shown), which has been adjusted not to functionally detect a weak current corresponding to the programmed HRS state, shall not a fortiori detect an even weaker current resulting from the original resistive state.

a second option consists in electrically forming therein 10 a filament and then in executing a RESET operation 20 in order to break it, and to put the cell in its programmed HRS state. Under these conditions, all the cells in the matrix are, upon completion of the step of reprogramming 50 in resistive states which can be obtained with the electrical operations normally carried out by the peripheral reading and writing circuits (not shown). In this case, during the functional use of the device, it is not necessary to provide for a specific writing operation in the cells which would have been left in their original state and for which a filament should first be formed.

The pre-programming process described above is unrestrictedly applied to the two above mentioned OxRAM memory types, i.e. the so-called polarized or bipolar ones, and the so-called not polarized ones.

In an advantageous option, it should be noted that the cells pre-programmed with "1" prior to applying the thermal stress (typically corresponding to a step of welding) can be pre-programmed several times by executing RESET and SET cycles, so as to make sure they actually are functional. Such SET and RESET operation sequences also aim at stabilizing the conducting filament which has been formed. Advantageously, the cells which would prove to be not complying with the specifications, for instance, having particularly high or dispersed SET values, can be declared non functional. They will not be used but will be replaced by other functional cells. The contents thereof shall then be transferred by implementing the redundancy techniques developed for other types of memories like the so-called FLASH memories which may be used with individual cells, non functional cells or even pages.

FIG. 4 illustrates the various resistive states that an exemplary memory cell 401 may take according to the invention. The ordinate of diagram 400 is the current flowing through the cell, as a function of the voltage applied to the terminals thereof.

As mentioned above, during the step of re-programming, the resistance of the cell is measured under "low field" conditions, by applying moderate voltages which cannot affect the value thereof. Typically, at a few hundreds of millivolts 414 around zero volt. Under these conditions, the cells which have been programmed prior to the step of mounting, during which a thermal stress is applied to the memory cell (e.g., reflow soldering) can be retrieved. As a matter of fact, the memory cells which have been left in their original state (original HRS) have a resistance value which is greater by several orders of magnitude than the SET resistance, or even the RESET resistance, since the device never can electrically retrieve its original resistive state (original HRS) as obtained at the end of the production cycle.

As can be seen in curve 410 of the diagram 400, wherein the ordinate is the evolution of current during the initial forming of the filaments, the currents measured as low voltage currents (from 0 to + or −0.2V for example) are extremely weak 412, of the order of $10^{-13}$ to $10^{-12}$ ampere. In practice, this is a highly resistive non conducting state.

After a first formation of filaments, the RESET and SET operations described above will make the device work in a lower range of values which is illustrated by the curves 420 and 430 corresponding to a polarized operation of the considered device, wherein the filaments are formed with a positive voltage, a RESET operation is executed with a negative voltage and a SET operation with a positive voltage.

The weakest currents measured with a low voltage are then always higher than $10^{-10}$ ampere 422 i.e. far higher than those corresponding to the original state of the cell.

A memory cell which has been pre-programmed prior to welding may thus have lost its LRS state, which is thermally unstable, as mentioned above. However, its state, which then corresponds to the programmed HRS state 422 may be clearly differentiated from the original state 412.

In the illustrated example, for voltages ranging from −0.2V to 0.2V, the current discrepancy between the cells in their original HRS state, on the one hand and the cells in their programmed HRS or LRS state, on the other hand is always greater than three orders of magnitude. Such a discrepancy is illustrated by the arrow in FIG. 4. As a matter of fact, the cells in the programmed HRS or LRS state, the weaker current is obtained for 0.2V and is equal to $10^{-9}$ ampere 422 whereas, for the cells in the original HRS state, the most intense current, obtained for 0.2V, is equal to $10^{-12}$ ampere 412.

More generally, the set of cells in the LRS state 420 and in the programmed HRS state 430 have a resistance (or are gone through by a current) which is significantly different from the set of cells in the original HRS state 410. A discrepancy thus separates the distribution of the cells in the LRS state or in the programmed HRS state from the distribution of the cell in the original HRS state.

The pre-programming state of the device can thus be recovered even though cells had lost their pre-programmed LRS state because of the thermal stress.

The above description more particularly discloses embodiments wherein the step of mounting is executed by welding or brazing. The invention also extends to embodiments wherein the mounting of the component containing the matrix of memory cells on a support is executed using the so-called WLCSP (Wafer Level Chip Scale Packages) technique.

Such mounting technique has been developed by the micro-electronics industry to enable the mounting of the components belonging to an embedded system on one or more printed circuits. This technique relies on the deposition, onto the component to be mounted, of a layer of photodefinable polymeric material, for instance a polyimide material, i.e. a polymeric material containing one or more imide groups in its main chain, or polybenzobisoxazole, also called PBO. As these materials are photodefinable, the layer thus deposited can be etched by being exposed to a suitable light stimulus followed by a development. A metal ball may then be placed in the cavity which has just been obtained. This ball is responsible for the mechanical and electrical contacts between the component to be mounted and the corresponding printed circuit(s).

In some cases, the deposit of a metal layer, for example of copper, called a ReDistribution Layer or RDL, which is etched, is substituted for the metal ball deposit. Such RDL layer is then encapsulated using a photodefinable polymeric material which is, in turn, etched by being exposed to a suitable light stimulus and a development. This ball which is responsible for the mechanical and electrical contacts between the component to be mounted and the corresponding printed circuit(s) is then placed in the cavity which has just been obtained.

In some cases, the deposition of the metal ball is preceded by obtaining a so-called UBM (for Under Bump metallurgy) metal layer, made of Copper or Nickel-based (refer to the Figures hereunder).

The layer(s) of the polymeric material must often be obtained using a method including steps of high temperature annealing. An example of the main steps required for obtaining a layer of polymeric material which may be used in the mounting techniques described above is provided in the following:

Preparation of the substrate: T° 80° C.-200° C.—Duration: 60-240 seconds (s)
Soft bake: T° 120° C.—Duration: 180 s
Nitrogen curing (HD2280)
   Temperature increase: 25° C.→150° C. with a gradient of 4° C./min
   Temperature increase: 150° C.→320° C. with a gradient of 2.5° C./min
   Temperature hold: 320° C. for 1 hour
   Progressive cooling to ambient temperature
The above-mentioned indications relate to another example of nitrogen curing (HD-4100):
   Temperature increase: 25° C.→200° C. with a gradient of 10° C./min
   Stand-by at 200° C. for 30 min
   Temperature increase: 200° C.→375° C. with a gradient of 10° C./min
   Temperature hold: 375° C. for 1 hour
   Progressive cooling to ambient temperature These methods thus comprise at least a step at a temperature above 240° C., often above 300° C. and most often between 320° C. and 375° C. for several dozens of minutes, typically 60 minutes.

The invention makes it possible to retrieve, after the step at a very high temperature, the data saved prior to mounting.

The present invention can thus be applied to all the memory cells wherein the difference of current measured with a low voltage shows a discrepancy sufficient to be detected unambiguously, between, on the one hand, the cells in their original HRS state and, on the other hand, the cells in their programmed HRS state or in their LRS state. Preferably, such current difference is at least a factor 2 in the measured current (or resistance). Still more preferably, such discrepancy in the current is at least a factor 10. Still more preferably, such discrepancy in the current is at least a factor 100.

In other words, the invention applies to all the memory cell matrices produced using a technological process, materials and manufacturing conditions which make it possible to reproducibly and reliably obtain, on all the cells manufactured on a production line, a statistical distribution of the resistances of the cells in their original HRS state so that it does not overlap the distribution of the cells in their programmed HRS state or in their LRS state. In other words, so that the distributions of these parameters, i.e. original HRS on the one hand and programmed HRS or LRS on the other hand, can be considered as separated for each memory cell matrix produced.

The invention is not limited to the embodiments described but applies to any embodiment complying with the spirit of the claims.

Although in the detailed description illustrating the Figures, the case where the cells, prior to mounting, are either in the original state (original HRS), or in the second resistive state (LRS) is mainly considered, the invention more particularly covers the cases where the cells, prior to mounting, are brought from the second resistive state (LRS) to the third resistive state (programmed HRS).

Besides, the invention covers the cases wherein, after mounting, the cells of the matrix have one of the following couples:
   original resistive state (original HRS)/second resistive state (LRS);
   original resistive state (original HRS)/third resistive state (programmed HRS);
   third resistive state (programmed HRS)/second resistive state (LRS);

The invention claimed is:

1. A method for pre-programming a matrix of resistive non-volatile memory cells, with said memory cells comprising a dielectric material positioned between two conducting electrodes, with said memory cells being initially in an original resistive state (original HRS) and the dielectric material being able to be so electrically modified as to bring the memory cell from the original resistive state (original HRS) to at least another resistive state (LRS, programmed HRS) wherein the resistance of the memory cell is at least twice and preferably at least ten times lower than the resistance of the memory cell in the original resistive state (original HRS), at least for a reading voltage interval, characterized in that the method comprises the following steps:
   prior to mounting a component containing said matrix on a support,
      programming the matrix by electrically bringing a plurality of cells (320) from the original resistive state (original HRS) to said other resistive state leaving the other memory cells in the original resistive state (original HRS) thereof;
   mounting said matrix on a support, during the step of assembling the memory cells being submitted to a temperature of at least 240° C.

2. A method according to claim 1, wherein the step of mounting comprises at least one among the following steps: a step of brazing, a step of welding, a step of mounting using the so-called wafer level chip scale packaging technique (WLCSP).

3. A method according to claim 1, wherein the step of mounting comprises the application of a temperature higher than or equal to 260° C. for at least 10 seconds.

4. A method according to claim 1, wherein the method comprises the following step of identification, executed after mounting the component containing said matrix on the support:
   for at least a set of memory cells in the matrix, applying a voltage selected in the reading interval;
   if the cell has the resistance of the original resistive state (original HRS), deduce therefrom that the cell was in the original resistive state (original HRS) after programming and prior to mounting; otherwise, deduce therefrom that the cell was not in the original resistive state (original HRS) after programming and prior to mounting.

5. A method according to claim 4, wherein said other resistive state is a second resistive state (LRS) directly obtained by applying a voltage from the original resistive state (original HRS).

6. A method according to claim 5, wherein the step of applying to the memory cell a voltage higher than said reading interval so as to bring or to maintain the memory cell in(to) said second resistive state (LRS) comprises applying a voltage ranging from 500 mV to 2.5V, and, preferably from 1V to 2V.

7. A method according to claim 5, wherein the step of applying to the memory cell a voltage higher than said reading interval so as to bring the memory cell to said second resistive state (LRS) is a SET operation.

8. A method according to claim 4, wherein said other resistive state is a third resistive state (programmed HRS) and wherein programming the memory cell from the original resistive state (original HRS) to the third resistive state (programmed HRS) comprises the following steps, executed prior to the mounting:
applying a voltage to the memory cell so as to bring the memory cell from the original resistive state (original HRS) to a second resistive state (LRS);
applying a voltage to the memory cell so as to bring the memory cell from the second resistive state (LRS) to the third resistive state (programmed HRS).

9. A method according to claim 5, wherein the method comprises the following steps, executed prior to mounting the component containing said matrix on the support:
identifying whether the memory cell is in the original resistive state (original HRS);
if the memory cell is not in the original resistive state (original HRS), applying to the memory cell a voltage higher than the reading interval so as to bring back or to maintain the memory cell in said second resistive state (LRS).

10. A method according to claim 4, wherein the method comprises the following steps, executed prior to mounting the component containing said matrix on the support:
identifying whether the memory cell is in the original resistive state (original HRS);
if the memory cell is not in the original resistive state (original HRS), applying to the memory cell a voltage, the amplitude of which is higher than the reading interval so as to bring the memory cell in a third resistive state (programmed HRS) wherein the resistance of the memory cell has a resistance which can be differentiated from the resistance of the memory cell in the original resistive state (original HRS) by applying a voltage selected in the reading interval.

11. A method according to claim 10, wherein, in the third resistive state (programmed HRS), the memory cell has a resistance lower by at least a factor 2 than the resistance of the memory cell in the original resistive state (original HRS) and, preferably by at least a factor 10.

12. A method according to claim 4, wherein if it is deduced that the memory cell is in the original resistive state (original HRS), then the memory cell is left in the original resistive state (original HRS).

13. A method according to claim 5, wherein if a memory cell is identified as being in the original resistive state (original HRS), then the following steps are executed:
electrically modifying the dielectric material to bring the memory cell from the original resistive state (original HRS) to the second resistive state (LRS),
electrically modifying the dielectric material to bring the memory cell from the second resistive state (LRS) to a third resistive state (programmed HRS) wherein the memory cell has a resistance different from that of the memory cell in the second resistive state (LRS).

14. A method according to claim 13, wherein the step of electrically modifying the dielectric material so as to bring the memory cell in said third resistive state (programmed HRS) is a RESET operation.

15. A method according to claim 13 wherein, in the third resistive state (programmed HRS) the memory cell has a resistance higher than that of the memory cell in the second resistive state (LRS) so that a reading circuit can identify whether the cell is in the second resistive state (LRS) or in the third resistive state (programmed HRS).

16. A method according to claim 15, wherein, in the third resistive state (programmed HRS), the memory cell has a resistance lower by at least a factor 2 than the resistance of the memory cell in the original resistive state (original HRS) and, preferably by at least a factor 10.

17. A method according to claim 4, wherein the step of identification is executed on all the memory cells in the matrix.

18. A method according to claim 1, wherein said reading interval ranges from −4 to 4 volts, preferably from −0.1 to 0.1 volts, more preferably from −0.05 to 0.05 volts and still more preferably from 0 to 0.01 volts.

19. A method according to claim 5, wherein the resistances of the memory cells in the matrix which are in the original resistive state (original HRS) are included in a first range of values, the resistances of the memory cells in the second resistive state (LRS) are included in a second range of values, and wherein the first and second ranges are separated at least for voltages included in said reading interval.

20. A method according to claim 19, wherein the first and second ranges show a discrepancy of at least a factor 10, and preferably at least a factor 100 at least for voltages included in said reading interval.

21. A method according to claim 19, wherein the resistances of the memory cells in a third resistive state (programmed HRS) are included in a third range of values, with the first and the third ranges being separated at least for voltages included in said reading interval.

22. A method according to claim 21, wherein the first and third ranges show a discrepancy of at least a factor 10, and preferably at least a factor 100 at least for voltages included in said reading interval.

23. A method according to claim 21, wherein the second and third ranges show a discrepancy of at least a factor 2, and preferably at least a factor 10 at least for voltages included in said reading interval.

24. A method according to claim 19, wherein identifying whether each memory cell is in the original resistive state (original HRS) comprises:
applying on each memory cell a voltage ranging in said reading interval and,
measuring the intensity of the current flowing through the memory cell in order to deduce therefrom whether the resistance of such memory cell is included in the first range of values.

25. A method according to claim 5, wherein the method comprises, after the step of programming and prior to mounting, at least a cycle of steps executed on the cells of said plurality of cells brought to the second resistive state (LRS), with each cycle comprising:
electrically modifying the dielectric material to bring said memory cells from the second resistive state (LRS) to a third resistive state (programmed HRS) wherein the memory cells have a resistance higher than that of the memory cells in the second resistive state (LRS), then
electrically modifying the dielectric material to bring back said cells into said second resistive state (LRS).

26. A method according to claim 25, wherein, upon completion of at least one cycle of steps, the cells which are not in the second resistive state (LRS) are identified among the cells of said plurality of cells, and the contents of the identified cells is transferred to other memory cells.

27. A method according to claim 1, wherein the step of mounting the component containing said matrix on the support comprises mounting the component onto a printed card, an electronic card, another electronic component or box.

28. A method according to claim 1, wherein all the current flowing through the two conducting electrodes goes through the dielectric material.

29. A method according to claim 1, wherein the dielectric material is in contact with each one of the two conducting electrodes.

30. A micro-electronic device comprising a matrix of non volatile resistive memory cells comprising a dielectric material positioned between two conducting electrodes, with the cell being so configured that electric current flows through the dielectric material when the conducting electrodes are connected to an electric source, with the dielectric material being able to be electrically modified so as to bring the memory cell from an original resistive state (original HRS) corresponding to a first resistive state to at least another resistive state (LRS, programmed HRS) wherein the resistance of the memory cell is at least twice lower than the resistance of the memory cell in the original resistive state (original HRS), wherein the matrix is contained in a component, wherein the component is mounted on a support, characterised in that some cells of the matrix are in the original resistive state (original HRS) and in that the other cells are in a resistive state different from the original resistive state (original HRS).

* * * * *